United States Patent
Kaminaga et al.

(10) Patent No.: US 12,054,822 B2
(45) Date of Patent: Aug. 6, 2024

(54) SPUTTERING TARGET PRODUCT AND METHOD FOR PRODUCING RECYCLED SPUTTERING TARGET PRODUCT

(71) Applicant: JX Nippon Mining & Metals Corporation, Tokyo (JP)

(72) Inventors: Kengo Kaminaga, Ibaraki (JP); Keijiro Sugimoto, Ibaraki (JP); Yuki Yamada, Ibaraki (JP); Shuhei Murata, Ibaraki (JP)

(73) Assignee: JX Advanced Metals Corporation, Tokyo (JP)

( * ) Notice: Subject to any disclaimer, the term of this patent is extended or adjusted under 35 U.S.C. 154(b) by 329 days.

(21) Appl. No.: 17/425,386

(22) PCT Filed: Jan. 15, 2020

(86) PCT No.: PCT/JP2020/001111
§ 371 (c)(1),
(2) Date: Jul. 23, 2021

(87) PCT Pub. No.: WO2020/195030
PCT Pub. Date: Oct. 1, 2020

(65) Prior Publication Data
US 2022/0098723 A1 Mar. 31, 2022
US 2023/0132362 A9 Apr. 27, 2023

(30) Foreign Application Priority Data
Mar. 28, 2019 (JP) .................................. 2019-064775

(51) Int. Cl.
*H01J 37/34* (2006.01)
*C23C 14/34* (2006.01)

(52) U.S. Cl.
CPC ...... *C23C 14/3414* (2013.01); *H01J 37/3423* (2013.01)

(58) Field of Classification Search
None
See application file for complete search history.

(56) References Cited

U.S. PATENT DOCUMENTS 5,522,535 A * 6/1996 Ivanov .................. B23K 35/26
228/191
6,039,848 A 3/2000 Moslehi et al.
(Continued)

FOREIGN PATENT DOCUMENTS

CN 1308146 A 8/2001
JP 6-140330 A 5/1994
(Continued)

OTHER PUBLICATIONS

International Search Report and Written Opinion mailed Feb. 10, 2020 in corresponding PCT application No. PCT/JP2020/001111.
(Continued)

*Primary Examiner* — Jason Berman
(74) *Attorney, Agent, or Firm* — NIELDS, LEMACK & FRAME, LLC (57) ABSTRACT

The disclosure is related to reducing the cost of sputtering target products. Provided is a sputtering target product wherein: the sputtering target product includes a target, a backing plate or backing tube, and insert material layer; at least a part of the non-sputtering side of the target is profiled so as to have protrusions and recesses that have plane symmetry; the insert material layer is formed so as to adhere closely to the profiled side, and the insert material is made of metal with specific gravity that is at least less than those of the metal constituting the target.

16 Claims, 6 Drawing Sheets

(56) References Cited

U.S. PATENT DOCUMENTS

| | | | |
|---|---|---|---|
| 6,283,357 B1 | 9/2001 | Kulkarni et al. | |
| 2005/0284746 A1* | 12/2005 | Ivanov | C23C 14/3407 204/192.12 |

FOREIGN PATENT DOCUMENTS

| | | |
|---|---|---|
| JP | 2002-129316 A | 5/2002 |
| JP | 2004-530048 A | 9/2004 |
| JP | 2007-505217 A | 3/2007 |
| JP | 2010-537043 A | 12/2010 |
| JP | 2011-132587 A | 7/2011 |
| JP | 2016-191109 A | 11/2016 |
| JP | 2018-172797 A | 11/2018 |
| WO | 2002/099157 A1 | 12/2002 |
| WO | 2005/026406 A1 | 3/2005 |
| WO | 2009/023529 A1 | 2/2009 |

OTHER PUBLICATIONS

International Preliminary Report on Patentability issued Oct. 7, 2021 in corresponding PCT application No. PCT/JP2020/001111.

* cited by examiner

SPUTTERING TARGET PRODUCT AND METHOD FOR PRODUCING RECYCLED SPUTTERING TARGET PRODUCT

TECHNICAL FIELD

The disclosure is related to a sputtering target product and a method for producing a recycled sputtering target product.

BACKGROUND

A thin coating of metal or ceramic can be formed via, for example, sputtering. An example of a technical field that sputtering can be applied to includes a field of electronics, a field of corrosion-resistant material or decoration, a field of catalyst, a field of making wear-resistant material such as cutting material, and abrasive. In recent years, Ta sputtering target, etc., which are suitable for coating a complicated shape or for forming a complicated circuit, are utilized especially in the field of electronics.

Patent Document 1 and Patent Document 2 disclose inventions that improve the efficiency of a sputtering target usage. Specifically, they disclose that a backing plate comprises tube-shaped recesses and a target insert in the recesses. By reducing the amount of target material to be required, the productivity of a sputtering device is increased, thereby reducing cost.

Patent Document 3 discloses a sputtering target product, in which a target of tantalum or tungsten and a backing plate of Cu alloy are bonded by diffusion junction via insert material of aluminum or aluminum alloy with a thickness of 0.5 mm or more Patent Document 4 discloses a sputtering target product, in which a core backing component has some openings corresponding to the deepest erosion groove.

LIST OF PATENT LITERATURE

Patent Documents

[Patent Document 1] WO2005/026406 (JP2007-505217A)
[Patent Document 2] WO2002/099157 (JP 2004-530048A)
[Patent Document 3] JP2002-129316A
[Patent Document 4] WO2009/023529 (JP2010-537043A)

SUMMARY OF INVENTION

Problems to be Resolved by the Invention

As described above, although reducing cost for a sputtering target product has been tried, there is still room for improvement in view of cost. An object of the disclosure is to provide a sputtering target product, of which cost is reduced via a different approach from those of the above-described patent documents.

Means of Solving the Problems

Figure 7:
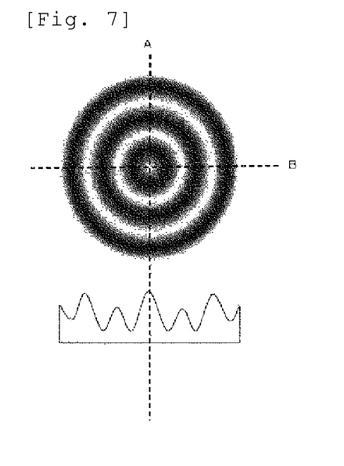
FIG. 7 shows a surface of a target after usage (prior-art). The shape of a target is circular and the line A indicates a plane of symmetry (see FIG. 10). The lower figure shows a cross section in which the circular target in the upper figure is cut along the line B.
Figure 8:
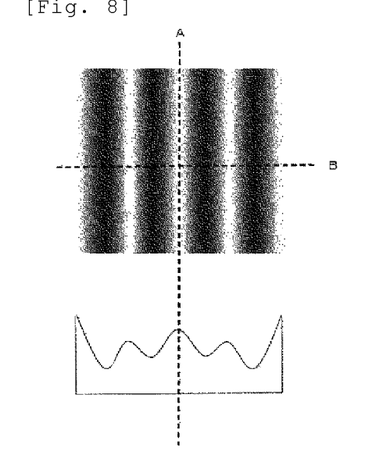
FIG. 8 shows a surface of a target after usage (prior-art). The shape of a target is rectangular and the line A indicates a plane of symmetry (see FIG. 11). The lower figure shows a cross section in which the rectangular target in the upper figure is cut along the line B.
Figure 9:
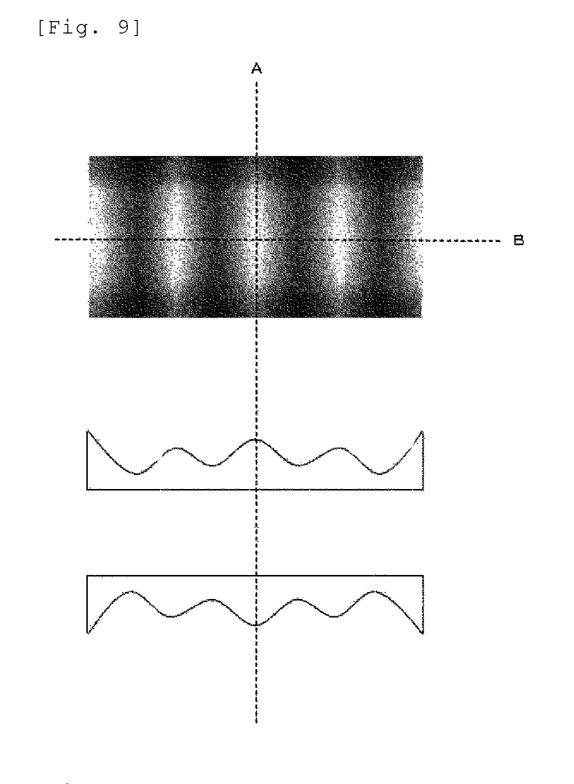
FIG. 9 shows a surface of a target after usage (prior-art). The shape of a target is tubular and the line A indicates a plane of symmetry (see FIG. 12). The lower figure shows a cross section in which the tubular target in the upper figure is cut along the line B. The line A is perpendicular to the long axis of the tube. The line B is parallel to the long axis of the tube.
Figure 10:
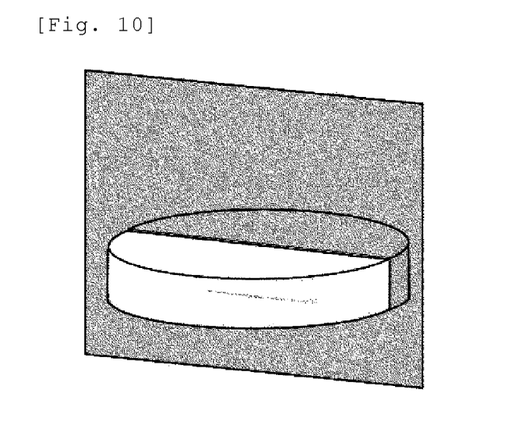
FIG. 10 shows a three-dimensional image of a plane of symmetry corresponding to the line A drawn in FIG. 7.
Figure 11:
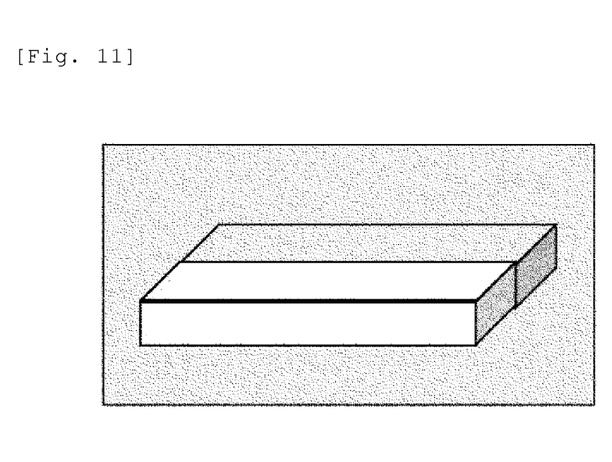
FIG. 11 shows a three-dimensional image of a plane of symmetry corresponding to the line A drawn in FIG. 8.
Figure 12:
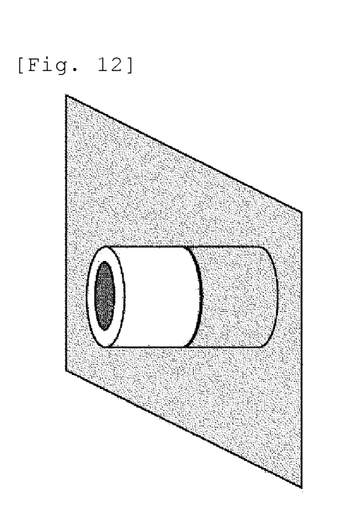
FIG. 12 shows a three-dimensional image of a plane of symmetry corresponding to the line A drawn in FIG. 9.

The present inventors intensively studied, and as a result, have focused on the weight of a sputtering target product. A component of a thin coating is relatively heavy in its specific weight such as heavy metal, etc. Thus, the weight of a sputtering target product is large. That means the cost of transferring increases, and such heavy weight makes the handling of this difficult. Considering the situation of using a sputtering target product, a part of a target, which includes a component for forming a thin coating, is not necessarily eroded uniformly. Practically, as shown in FIGS. 7-9, a target is eroded so as to form protrusions and recesses that have plane symmetry. Thus, a part of a target where an amount of erosion is large needs to be thick accordingly. Meanwhile, even though a part of a target where an amount of erosion is small is thin in target thickness, that will not be problematic. In other words, a part of a target where an amount of erosion is small may be thin in target thickness. Corresponding to an amount of reducing thickness, it can be compensated with light metal that is lighter in its specific weight than those of metal constituting a target. Thereby, a total weight of a product can be reduced.

The present invention has been completed in the light of the above and in one aspect, includes the following inventions.

(Invention 1)
A sputtering target product including a target, a backing plate or a backing tube, and insert material layer,
  wherein at least a part of a non-sputtered side of the target is profiled such that the non-sputtered side has protrusions and recesses that have plane symmetry,
  the insert material layer is formed so as to adhere closely to the profiled side, and
  the insert material is made of metal with specific gravity that is at least less than those of metal constituting the target.

(Invention 2)
A sputtering target product of Invention 1, wherein a melting point of the insert material is lower than those of the target.

(Invention 3)
A sputtering target product of Invention 1 or 2,
  wherein an etching rate of the insert material is higher than those of the target, and
  at least a part of a lateral side of the insert material layer is exposed without being covered by the target or the backing plate or the backing tube.

(Invention 4)
A sputtering target product of Invention 1,
  wherein the target is made of Ta or Ta alloy,
  the backing plate or the backing tube is made of Cu or Cu alloy, and
  the insert material is made of Al or Al alloy.

(Invention 5)
A sputtering target product of any one of Inventions 1-4,
  wherein all parts of the non-sputtered side of the target are covered by the insert material, or are covered by both the backing plate or the backing tube and the insert material.

(Invention 6)
A sputtering target product of Invention 5, wherein all parts of the non-sputtered side of the target are covered by the insert material.

(Invention 7)
A method for producing a recycled sputtering target product of any one of Inventions 1-6, the method including:
  separating the target and the backing plate or the backing tube; and
  bonding the backing plate or the backing tube to a new target,
  wherein the separating includes any one of:
  softening or melting the insert material by heat treatment; and
  etching the insert material.

Effect of Invention

In one aspect of the above inventions, at least a part of a non-sputtered side is profiled such that the non-sputtered side has protrusions and recesses that have plane symmetry, the insert material layer is formed so as to adhere closely to the profiled side, and the insert material consists of metal with specific gravity that is at least less than those of metal constituting the target. Thereby, the total weight of a sputtering target product can be reduced, thereby reducing cost.

DESCRIPTION OF EMBODIMENTS

Now, more specified embodiments are described hereinafter, which are for the purpose of enhancing the understanding of the present invention. In other words, they are not intended to limit the scope of the present invention.

1. Constitution of a Sputtering Target Product

In one embodiment, the disclosure is related to a sputtering target product. The sputtering target product includes a target, a backing plate or a backing tube, and insert material layer. At least a part of a non-sputtered side of the target is profiled such that the non-sputtered side has protrusions and recesses that have plane symmetry. In this context, the term "profiled" means that the surface is formed or processed (e.g., molding, grinding, cutting, etc.) such that it has a certain shape. Insert material layer is formed so as to adhere closely to the profiled side. Insert material consists of metal with specific gravity that is at least less than those of metal constituting a target.

Features of a sputtering target product in one embodiment are described hereinafter.

2. Target

A component of a target may be the same as a component (or a part of components) of a coating to be formed. Though not particularly limited, a component of a target may be selected from, for example, a group consisting of Sc, Ru, Rh, Pd, Re, Ir, Pt, Ta, Cu, Ti, W, Mo, Co, Nb, Zr, and Hf and an alloy containing at least one of them. Preferably, a component may be Ta or Ta alloy.

A shape of a target may be, not particularly limited, tubular, or planary. A planary target may be rectangular or circular. Hereinafter, the description is made with an example of a planary target.

A target has a sputtered side and a non-sputtered side. A sputtered side is the one where collision of Argon gas etc. occurs during sputtering, and a non-sputtered side is the opposite side of the sputtered side.

A non-sputtered side is profiled so as to have protrusions and recesses that have plane symmetry. A plane of symmetry may exist, for example, such that it passes through the center of a target, and such that it is parallel with the direction of thickness of a target. In this context, the direction of thickness is perpendicular to the surface to be sputtered. A non-sputtered side may be profiled such that a pair of the same shapes of protrusions and/or a pair of the same shapes of recesses exists at the same distance from a plane of symmetry. In a specific embodiment, a shape of a target is a disc, and in such a case, a profile is concentric circular. Thus, the above term "plane symmetry" includes the concept of "concentric circular."

For example, if a shape of a target is circular, a position of a plane of symmetry is the same as the position where a plane passes through the center of the circle. In addition, if a shape of a target is circular, grooves that are formed by the combination of protrusions and recesses are formed in a concentric circular manner.

For example, if a target is rectangular, a position of a plane of symmetry meets the following two conditions. The first is that a plane of symmetry passes through the center of a rectangle (for example, an intersection point of two diagonals of the rectangle). The second is that a plane of symmetry is parallel with two sides of the rectangle which are opposite from each other. In addition, a shape of a target is rectangular, grooves that are formed by the combination of protrusions and recesses are parallel with a plane of symmetry.

For example, if a shape of a target is tubular, a position of a plane of symmetry meets the following two conditions. The first is that a plane of symmetry passes through the center of the longitudinal direction of the tube. The second is that a plane of symmetry is parallel with the direction of radius. In addition, if a shape of a target is tubular, grooves that are formed by the combination of protrusions and recesses are parallel with a plane of symmetry.

The reason why the surface of a target is profiled so as to have protrusions and recesses that have plane symmetry is that distribution of erosion is formed in a plane symmetry manner during sputtering (FIG. 7-9). In other words, some parts of a target may be prone to be shaved by sputtering and other parts may not, both of which exit alternately and in a plane symmetry manner (see the dotted line in FIG. 2). Thus, parts of a target may be prone to be shaved by sputtering may be thick, and parts of a target may NOT be prone to be shaved by sputtering may be thin, thereby, improving efficiency of usability of sputtering. However, if a shape of a sputtered side is profiled to be too complicated, it may cause a problem such as arcing or ignition error, and thus, the extent of profiling of a sputtered side is limited. In this respect, it is preferable to profile a non-sputtered side. Thus, in one embodiment, plane-symmetric protrusions and recesses of a non-sputtered side of a target can be decided at least on the basis of plane-symmetric protrusions and recesses of a sputtered side, which may be formed depending on sputtering conditions to be applied.

Figure 1:
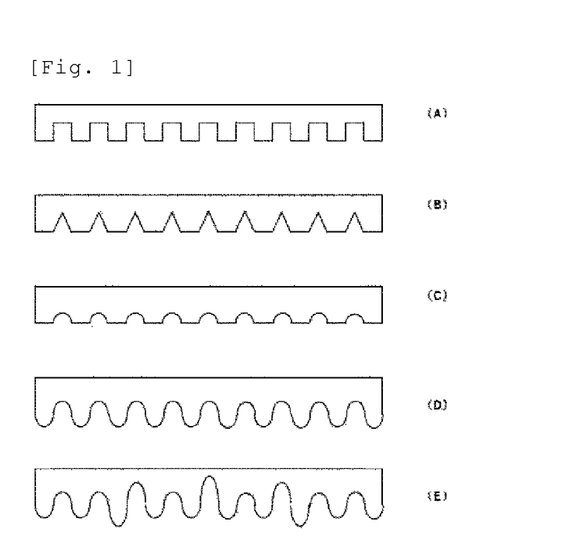
FIG. 1 shows variations of profile in one embodiment.

A shape of profile may be, not particularly limited, for example, an arbitrary shape of protrusions and recesses as shown (A)-(E) of FIG. 1. FIG. 1 shows cross sections of targets, the upper side indicates a sputtered side and, the lower side indicates a non-sputtered side. For example, as shown in FIG. 1(A), grooves may be rectangular. For example, as shown in FIG. 1(B), grooves may be a triangle. For example, as shown in FIG. 1(C), grooves may be semi-circular. For example, as shown in FIG. 1(D), grooves may be sine-curve. For example, as shown in FIG. 1(E), the depth of grooves or the height of mountains may be variable (not uniform).

Incidentally, the number of specific gravity of a target may be not particularly limited and may be decided in view of the relation with specific gravity of insert material. However, the number of specific gravity of a target at room temperature is preferably, at least 2.900 g/cm$^3$ or more, more preferably at least 12.000 g/cm$^3$ or more. Though not particularly limited, it is preferable that the upper limit of specific gravity at room temperature is typically 25.000 g/cm$^3$ or less.

The melting point of a target is not particularly limited. In a preferred embodiment, the melting point of a target may be decided in view of the relation with the melting point of insert material. For example, the melting point of a target may be 1000 C degrees or more, preferably, 1500 C degrees or more. The upper limit melting point of a target may be, not particularly limited, typically 3500 C degree or less.

3. Backing Plate or Backing Tube

A backing plate or a backing tube is bonded to a target to support the target. A backing plate or a backing tube may include a water channel therein. Thereby, water may be loaded to the water channel during operation, to cool down a sputtering target as a whole for the purpose of avoiding insert material from being melted and avoiding a target from being separated. A backing plate or a backing tube has two sides, one of which is bonded to a target and/or insert material, and the other of which is opposite therefrom. The side which is bonded to a target and/or insert material may be flat and smooth, alternatively, may include a recess to embed therein a target.

A component of a backing plate or a backing tube may be, not particularly limited, Cu, Ti, Mo, or an alloy containing at least one of them (for example, Cu—Ni—Si alloy (for example, C18000, etc.), Cu—Zn alloy, Cu—Cr, alloy), etc. Preferably, material for a backing plate or a backing tube is the one having high heat conductivity, and from this point of view, Cu is suitable.

4. Insert Material

Insert material is inserted between a target and a backing plate or a backing tube, which combines both of them. Insert material includes at least two parts, one of which contacts with a non-sputtered side of a target, and the other of which contacts with a backing plate or a backing tube. As described above, since a non-sputtered side of a target is profiled such that a non-sputtered side has protrusions and recesses that have plane symmetry, the part which contacts with a non-sputtered side of a target is shaped such that it adheres closely to the profiled surface. The other part of the insert material which contacts with a backing plate or a backing tube may be shaped, not particularly limited, such that it adheres closely to the backing plate or the backing tube.

Figure 5:
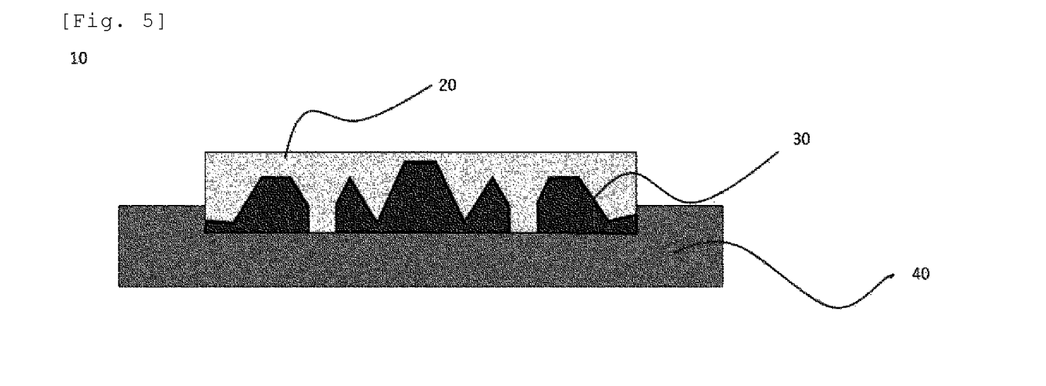
FIG. 5 shows that all of the non-sputtered side of a target is covered by a backing plate and insert material in one embodiment.

Incidentally, it is not necessary that insert material covers all of the parts of a non-sputtered side of a target. For example, although in FIG. 2, thick parts and thin parts of insert material are shown alternately, the thickness of a thin part may be zero in extreme case (i.e., some parts of a target may contact with a backing plate or a backing tube directly without being mediated by insert material). If the thickness of some parts is zero, insert material may be composed of a plural of blocks (FIG. 5).

A component of insert material consists of metal that is lighter in its specific gravity than those of metal constituting a target. Preferably, all of the metal that accounts for 10 mass percent or more in insert material is lighter by 5 g/cm$^3$ or more, more preferably 8 g/cm$^3$ or more, yet more preferably 10 g/cm$^3$ or more than any metal that accounts for 10 mass percent or more in a target. Although the upper limit of an amount of difference in specific gravity between metal accounting for 10 mass percent or more in insert material and metal accounting for 10 mass percent or more in a target is not particularly limited, an amount of difference, for example, may be 20 g/cm$^3$ or less, typically, 15 g/cm$^3$ or less.

For example, if a component of a target is Ta (about 16.654 g/cm$^3$ at room temperature), a component of insert material may be Al (about 2.70 g/cm$^3$ at room temperature) and/or Zn (about 7.14 g/cm$^3$ at room temperature), which is lighter than those of metal constituting a target. Because insert material adheres closely to the side being profiled as described above and because a component of insert material consists of metal that is lighter in its specific gravity than those of metal constituting a target, a whole amount of weight of a sputtering target product may be reduced.

A typical component may be Al and Zn and an alloy containing at least one of them, etc.

In a preferred embodiment, a component of insert material at least consists of metal that is lighter in its specific gravity than metal constituting a backing plate or a backing tube. Preferably, all of the metal that accounts for 10 mass percent or more in insert material is lighter by 5 g/cm$^3$ or more, more preferably 8 g/cm$^3$ or more, yet more preferably 10 g/cm$^3$ or more than any metal that accounts for 10 mass percent or more in a backing plate or a backing tube. Although the upper limit of an amount of difference in specific gravity between metal accounting for 10 mass percent or more in insert material and metal accounting for 10 mass percent or more in a baking plate or a backing tube is not particularly limited, an amount of difference, for example, may be 20 g/cm$^3$ or less, typically, 15 g/cm$^3$ or less. Incidentally, the number of specific gravity of insert material may be not particularly limited and may be decided in view of the relation with specific gravity of a target. However, the number of specific gravity of insert material at room temperature is preferably, at least 8.000 g/cm$^3$ or less, more preferably at least 3.000 g/cm³ or less. The lower limit of the number of specific gravity of insert material at room temperature may be not particularly limited and the preferable lower limit may be typically 1.000 g/cm³ or more. For example, if a component of a target is Ta (about 16.654 g/cm³ at room temperature), and if a component of a backing plate is Cu (8.94 g/cm³ at room temperature), insert material may be Al (about 2.70 g/cm³ at room temperature), which is lighter than those of them.

Figure 3:
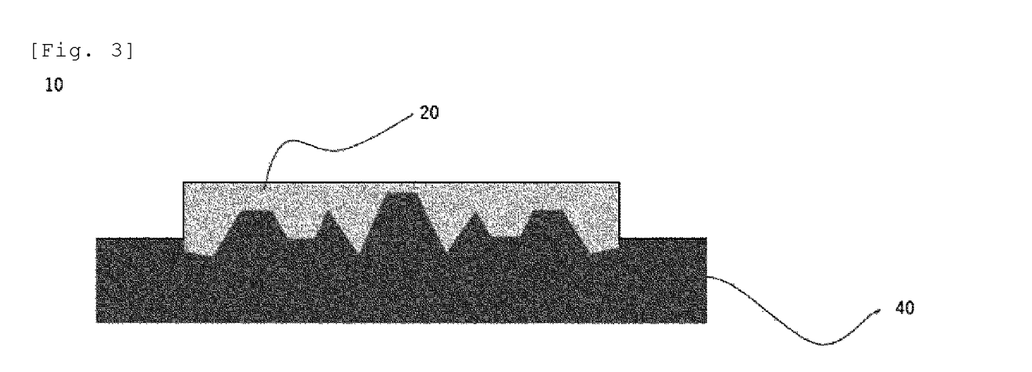
FIG. 3 shows that all of the non-sputtered side of a target is covered by a backing plate.

In a specific example to be compared with, assumed is that without insert material, a target and a backing plate or a backing tube are bonded to each other by heat treatment, etc. (FIG. 3). In this case, a non-sputtered side of a target is profiled and in accordance with this, a part of a backing plate or a backing tube also must be profiled.

However, in a preferred embodiment as described above, because a component of insert material at least consists of metal that is lighter in its specific gravity than metal constituting a backing plate or a backing tube, weight can be made smaller by this comparing the above example to be compared. In other words, profiled recesses in a target are filled not with a component of a backing plate or a backing tube, but with a component of insert material, thereby saving the weight.

Furthermore, in the example to be compared with, the strength of bond tends to be reduced and thus, separation may occur by physical stimulation during sputtering. Moreover, in the example to be compared with, a backing plate or a backing tube also need to be profiled, resulting in less efficiency of recycling.

In another preferred embodiment, the melting point of a component of insert material is lower than those of a target. More preferably, the melting point of a component of insert material is lower than those of a backing plate or a backing tube. For example, if a component of a target is Ta and component of a backing plate or a backing tube is Cu (both of the melting points for Ta and Cu is 1000 C degree or more), Al (melting point 660.32 C degree) or Al alloy may be used as a component of insert material. For example, Al of insert material partially becomes alloy together with Cu of a backing plate, resulting in a further decrease of the melting point (though it depends on the ratio of Cu and Al, 548 C degree for example). Thereby, recycle of a sputtering target product becomes easier. Specifically, by heat treatment at a temperature that is lower than the melting point of a target and that is near or higher than the melting point of insert material, a target and a backing plate or a backing tube can be easily separated from each other. The range of melting point of insert material is decided in view of the relation with the melting point of a target (more preferably, in view of the relation with melting points of a target and a backing plate or a backing tube) and may be preferably from 300 C degree to 700 C degree, though not particularly limited.

In addition, using material having a low melting point for insert material can stabilize the strength of bond. This is because material having a low melting point can be flexible under high temperature and high pressure during diffusion bonding, and because it is compatible with a complicated shape. These features are important in view of physical stimulation during sputtering. A sputtered side in a target is exposed to high temperature during sputtering, while a non-sputtered side is cool-downed by water, resulting in warpage deformation. Thus, it is likely to make bonding bad. However, by using material having a low melting point for insert material, it can be compatible with such warpage deformation and as a result, bad boding can be prevented.

Incidentally, although the strength of bond is not particularly limited, it may be preferably 6 kgf/mm² or more, more preferably, 9 kgf/mm² or more. The upper limit may be, not particularly limited, typically 30 kgf/mm² or less.

Moreover, using material having a low melting point for insert material is advantageous in view of accuracy for processing that is required for profiling a non-sputtering side. As stated above, since there is a problem such as ignition error etc. on a sputtered side, processing for profiling must be made with higher accuracy. Meanwhile, since there is not such a problem on a non-sputtered side, processing for profiling may be made with relatively less accuracy. For the purpose of bonding to a non-sputtered side that has been processed with less accuracy, insert material is preferably deformable. Material having a low melting point for insert material can meet the requirement.

Figure 2:
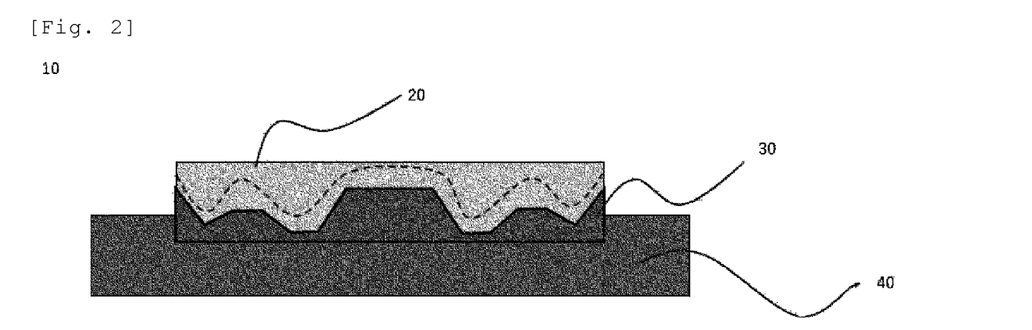
FIG. 2 shows that a part of insert material is exposed in one embodiment. The dotted line in FIG. 2 indicates the status of erosion by sputtering.

In another preferred example, a component of insert material is material having higher etching rate than those of a target (more preferably, a component of insert material is material having higher etching rate than those of a backing plate and a backing tube). For example, if a component of a target is Ta and a component of insert material is Al or Zn, the etching rate of Al or Zn is generally higher than that of Ta. In this preferred embodiment, as shown in FIG. 2, a part of insert material is exposed to outside. Thereby, it is possible to perform etching of insert material.

Thus, a sputtering target product can be recycled easily. Supecifically, insert material may be melted by etching, thereby easily separating a target from a backing plate or a backing tube.

If insert material is exposed, even if exposed partially, etching can start from the exposed part. The exposed part exists typically on the lateral side of insert material (i.e., a part other than the part where a target and a backing plate or a backing tube contact with each other).

Incidentally, the term "etching rate" described herein means the etching rate under 30% nitric acid aqueous solution (although temperature for a solution is not particularly limited, typically 35 C degrees).

Figure 4:
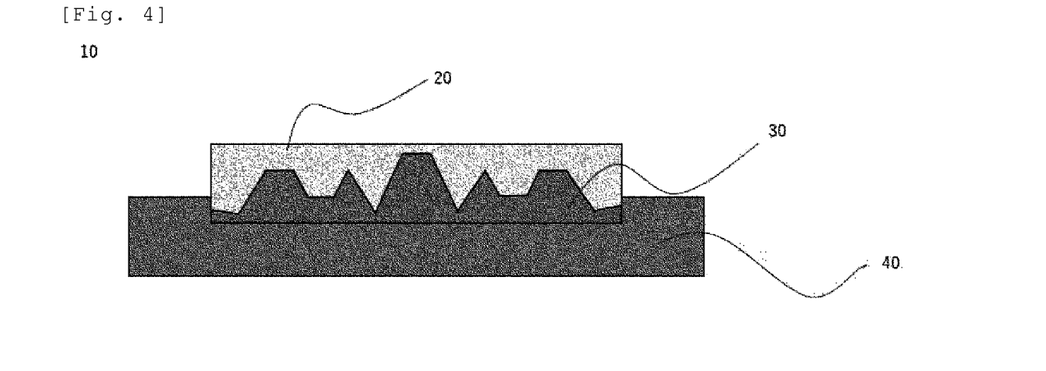
FIG. 4 shows that all of the non-sputtered side of a target is covered by insert material in one embodiment.

In another preferred embodiment, all parts of a non-sputtered side are covered by insert material (FIG. 4), or covered by both of a backing plate or a backing tube and insert material (FIG. 5). In the former case, in other words, all parts of a non-sputtered side of a target are covered by a backing plate or a backing tube with being mediated by insert material. In this case, a target and a backing plate may be separated more easily. In the latter case, some parts of a non-sputtered side of a target contact with insert material, and other parts of a non-sputtered side of a target contact with a backing plate or a backing tube.

Figure 6:
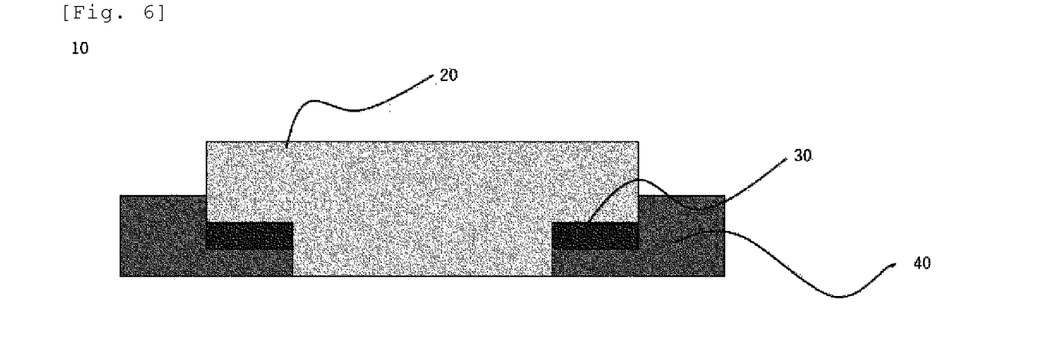
FIG. 6 shows that a part of the non-sputtered side of a target is exposed without being covered with a backing plate and insert material.

If a part of a non-sputtered side of a target is exposed (FIG. 6), eddy current, which is caused by rotation of magnet in magnetron sputtering, may affect adversely. However, if all parts of a non-sputtered side of a target are covered, such an adverse effect can be reduced.

5. A Method for Recycling

In one embodiment, the disclosure is related to a method for producing a recycled sputtering target product. The method includes the following steps:
separating a target and a backing plate or a backing tube
bonding a backing plate or a backing tube to a new target If the melting point of insert material is lower than those of a target, the step of separating includes softening or melting insert material by heat treatment. The heat treatment is preferably performed at the temperature near the melting point of insert material (for example, the melting point ±100 C degree) or higher, and at the temperature lower than those of a target. Thereby, without giving damage to a target, or with minimal damage, both of them can be separated.

Further, if the melting point of insert material is lower than those of a target and a backing plate or a backing tube, the heat treatment is preferably performed at the temperature near the melting point of insert material (for example, the melting point ±100 C degree) or higher, and at the temperature lower than those of a target and a backing plate or a backing tube. Thereby, without giving damage to a target and a backing plate or a backing tube, or with minimal damage, both of them can be separated.

Figure 13:
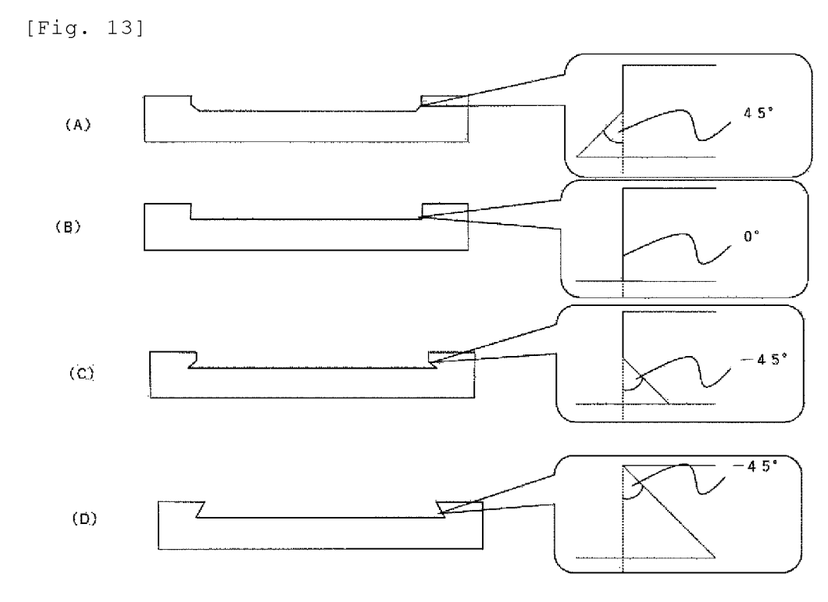
FIG. 13 shows the shape of the recesses of the backing plates. The angle of lateral wall of the recess is defined on the basis of the line perpendicular to the top side of a backing plate. Specifically, if the lateral wall of the recess is parallel to the perpendicular line, the angle is defined to be zero degree. Moreover, if the lateral wall forming the recess constitutes the shape dovetail, the angle is defined to be minus, and if opposite, the angle is defined to be plus. Incidentally, as shown in (C), if the line of the lateral wall is broken, the angle in the point of break is defined to be the angle that the lateral wall forms.

If etching rate of insert material is higher than those of a target, the step of separating includes melting insert material by etching treatment. Thereby, without giving damage to a target, or with minimal damage, both of them can be separated.

if etching rate of insert material is higher than those of a target and a backing plate or a backing tube, without giving damage to a target and a backing plate or a backing tube, or with minimal damage, both of them can be separated Incidentally, a backing plate (or a backing tube) may include a recess for inserting therein a target. However, when recycling, a used target needs to be separated from a backing plate (or a backing tube). Thus, a recess preferably has a shape that does not interfere with pulling out the used target from the recess. For example, an angle that is formed by lateral wall of the recess is preferably zero degree or more (for example, FIGS. 13(A) and (B)). Alternatively, it is preferable that a shape of a recess does not have a dovetail part (FIGS. 13 (C) and (D)). Thereby, a used target can be pulled out from a recess of a backing plate smoothly.

After separating, via a technique known in the art, a new target (including a used target that has been recycled after usage) is bonded again to a backing plate or a backing tube. Thereby, a recycled product for a sputtering target product is completed. Insert material at this time preferably has the same component as those of insert material before recycling. Furthermore, a new target is preferably profiled in its non-sputter side in the same manner as those of a target before recycling.

The detailed embodiments of the present invention have been described. The above embodiments are merely an example of the present invention, and the present invention is not limited to the above embodiments. For example, a technical feature disclosed in one embodiment may be applied to another embodiment. Furthermore, unless indicated specifically, regarding to a method or process, the order of some steps may be switched from other steps. Also, a further step may be inserted among certain two steps. The scope of the present invention is defined by the appended claim.

DESCRIPTION OF THE REFERENCE NUMERAL 10 a sputtering target product
20 a target
30 insert material
40 a backing plate

What is claimed is:

1. A sputtering target product comprising a target, a backing plate or a backing tube, and insert material layer,
    wherein at least a part of a non-sputtered side of the target is profiled such that the non-sputtered side has a plurality of protrusions and a single or a plurality of recesses that have plane symmetry,
    the insert material layer is formed so as to adhere closely to the profiled side,
    the insert material consists of metal with specific gravity that is at least less than those of metal constituting the target, and
    the backing plate or the backing tube has a single recess.

2. A sputtering target product of claim 1, wherein a melting point of the insert material is lower than those of the target.

3. A sputtering target product of claim 1,
    wherein an etching rate of the insert material is higher than those of the target, and
    at least a part of a lateral side of the insert material layer is exposed without being covered by the target or the backing plate or the backing tube.

4. A sputtering target product of claim 1,
    wherein the target consists of Ta or Ta alloy,
    the backing plate or the backing tube consists of Cu or Cu alloy, and
    the insert material consists of Al or Al alloy.

5. A sputtering target product of claim 1,
    wherein all parts of the non-sputtered side of the target are covered by the insert material, or are covered by both the backing plate or the backing tube and the insert material.

6. A sputtering target product of claim 5, wherein all parts of the non-sputtered side of the target are covered by the insert material.

7. A method for producing a recycled sputtering target product of claim 1, the method comprising:
    separating the target and the backing plate or the backing tube; and
    bonding the backing plate or the backing tube to a new target,
    wherein the separating includes any one of:
        softening or melting the insert material by heat treatment; and
        etching the insert material.

8. A sputtering target product of claim 2, wherein an etching rate of the insert material is higher than those of the target, and
    at least a part of a lateral side of the insert material layer is exposed without being covered by the target or the backing plate or the backing tube.

9. A sputtering target product of claim 2,
    wherein all parts of the non-sputtered side of the target are covered by the insert material, or are covered by both the backing plate or the backing tube and the insert material.

10. A sputtering target product of claim 3,
    wherein all parts of the non-sputtered side of the target are covered by the insert material, or are covered by both the backing plate or the backing tube and the insert material.

11. Sputtering target product of claim 8,
    wherein all parts of the non-sputtered side of the target are covered by the insert material, or are covered by both the backing plate or the backing tube and the insert material.

12. A sputtering target product of claim 4,
    wherein all parts of the non-sputtered side of the target are covered by the insert material, or are covered by both the backing plate or the backing tube and the insert material.

13. A sputtering target product of claim 9, wherein all parts of the non-sputtered side of the target are covered by the insert material.

14. A sputtering target product of claim 10, wherein all parts of the non-sputtered side of the target are covered by the insert material.

15. A sputtering target product of claim 11, wherein all parts of the non-sputtered side of the target are covered by the insert material.

16. A sputtering target product of claim 12, wherein all parts of the non-sputtered side of the target are covered by the insert material.

* * * * *